(12) United States Patent
Moue et al.

(10) Patent No.: US 10,965,301 B2
(45) Date of Patent: Mar. 30, 2021

(54) ANALOG-DIGITAL CONVERTER, SOLID-STATE IMAGING ELEMENT, AND ELECTRONIC EQUIPMENT

(71) Applicant: SONY SEMICONDUCTOR SOLUTIONS CORPORATION, Kanagawa (JP)

(72) Inventors: Takashi Moue, Kanagawa (JP); Takashi Matsumoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/486,244

(22) PCT Filed: Feb. 2, 2018

(86) PCT No.: PCT/JP2018/003612
§ 371 (c)(1),
(2) Date: Aug. 15, 2019

(87) PCT Pub. No.: WO2018/163679
PCT Pub. Date: Sep. 13, 2018

(65) Prior Publication Data
US 2020/0244277 A1  Jul. 30, 2020

(30) Foreign Application Priority Data
Mar. 8, 2017  (JP) .............................. JP2017-043470

(51) Int. Cl.
*H03M 3/00* (2006.01)
*H03M 1/06* (2006.01)
(Continued)

(52) U.S. Cl.
CPC ............ *H03M 1/0626* (2013.01); *H03F 3/45* (2013.01); *H03M 1/0648* (2013.01);
(Continued)

(58) Field of Classification Search
CPC ........ H03M 3/454; H03M 3/424; H03M 3/43; H03M 3/422; H03M 3/464; H03M 3/436;
(Continued)

(56) References Cited

U.S. PATENT DOCUMENTS 6,798,705 B2 * 9/2004 Baker ....................... G11C 7/06
365/207
8,698,664 B2 * 4/2014 Oliaei ..................... H03M 3/45
341/155
(Continued)

FOREIGN PATENT DOCUMENTS

JP   2012-165088 A   8/2012
JP   2015-115907 A   6/2015
(Continued)

OTHER PUBLICATIONS

Ahmed, et al., "A Low-Power Gm-C-Based CT-ΔΣ Audio-Band ADC in 1.1V 65nm CMOS", 2015 Symposium on VLSI Circuits Digest of Technical Papers, Jun. 17-19, 2015, 02 pages.
(Continued)

*Primary Examiner* — Linh V Nguyen
(74) *Attorney, Agent, or Firm* — Chip Law Group

(57) ABSTRACT

Included are a loop filter, a quantization circuit section, and a current steering digital-analog conversion section. The quantization circuit section converts a loop filter output into a digital value. The current steering digital-analog conversion section is provided in a feedback loop that feeds back the output of the quantization circuit section to the loop filter. Then, each of the analog-digital converters includes a first input signal current path, a second input signal current path, a first feedback current path, and a second feedback current path. The first input signal current path feeds a first input signal current to an input end of a first stage integrator of the loop filter. The second input signal current path feeds a second input signal current, a current opposite in sign to
(Continued)

the first input signal current, to an input end of a second stage integrator of the loop filter. The first feedback current path connects one feedback output end of the current steering digital-analog conversion section to the input end of the first stage integrator of the loop filter. The second feedback current path connects other feedback output end of the current steering digital-analog conversion section to the input end of the second stage integrator of the loop filter.

20 Claims, 10 Drawing Sheets

(51) Int. Cl.
  *H03F 3/45* (2006.01)
  *H04N 5/3745* (2011.01)
  *H04N 5/378* (2011.01)
(52) U.S. Cl.
  CPC .......... *H04N 5/378* (2013.01); *H04N 5/3745* (2013.01); *H03F 2203/45288* (2013.01)
(58) Field of Classification Search
  CPC ...... H03M 1/0673; H03M 3/452; H03M 3/30; H03M 3/458; H03M 3/414; H03M 3/438
  USPC ................................. 341/143, 118, 120, 155
  See application file for complete search history.

(56) References Cited

U.S. PATENT DOCUMENTS

| | | | | |
|---|---|---|---|---|
| 8,842,030 | B1* | 9/2014 | Fontaine | H03M 3/368 341/143 |
| 2004/0145504 | A1* | 7/2004 | Doerrer | H03M 3/37 341/143 |
| 2005/0068213 | A1* | 3/2005 | Fontaine | H03M 3/37 341/143 |
| 2007/0216557 | A1* | 9/2007 | Ebner | H03M 3/384 341/143 |
| 2011/0254718 | A1* | 10/2011 | Matsukawa | H03M 3/376 341/143 |
| 2013/0214950 | A1* | 8/2013 | Hojabri | H03M 3/494 341/143 |
| 2015/0171884 | A1 | 6/2015 | Tsukuda et al. | |
| 2015/0249801 | A1 | 9/2015 | Tokunaga et al. | |
| 2016/0028978 | A1* | 1/2016 | Yu | H04N 5/365 348/241 |
| 2016/0308553 | A1* | 10/2016 | Mitani | H04B 14/06 |
| 2016/0359499 | A1* | 12/2016 | Bandyopadhyay | H03M 3/352 |
| 2019/0341924 | A1* | 11/2019 | Li | H03M 1/1245 |

FOREIGN PATENT DOCUMENTS

| WO | 2014/087561 A1 | 6/2014 |
|---|---|---|
| WO | 2015/098057 A1 | 7/2015 |

OTHER PUBLICATIONS

International Search Report and Written Opinion of PCT Application No. PCT/JP2018/003612, dated Apr. 24, 2018, 08 pages of ISRWO.

Ahmed, et al., "A low-power Gm-C-based CT-ΔΣ audio-band ADC in 1.1V 65nm CMOS", Symposium on VLSI circuits (VLSI Circuits), IEEE, Sep. 3, 2015, pp. C294-C295.

* cited by examiner

ANALOG-DIGITAL CONVERTER, SOLID-STATE IMAGING ELEMENT, AND ELECTRONIC EQUIPMENT

CROSS REFERENCE TO RELATED APPLICATIONS

This application is a U.S. National Phase of International Patent Application No. PCT/JP2018/003612 filed on Feb. 2, 2018, which claims priority benefit of Japanese Patent Application No. JP 2017-043470 filed in the Japan Patent Office on Mar. 8, 2017. Each of the above-referenced applications is hereby incorporated herein by reference in its entirety.

TECHNICAL FIELD

The present disclosure relates to an analog-digital converter, a solid-state imaging element, and electronic equipment.

BACKGROUND ART

For example, a ΔΣ analog-digital converter is known as a type of analog-digital converter (converter) (refer, for example, to PTL 1). Of ΔΣ analog-digital converters, a continuous-time ΔΣ analog-digital converter is generally often provided with a plurality of digital-analog conversion sections (DA conversion sections) in a feedback loop in order to stabilize the feedback loop.

CITATION LIST

Patent Literature

[PTL 1]
Japanese Patent Laid-Open No. 2012-165088

SUMMARY

Technical Problem

As described above, the plurality of digital-analog conversion sections (converters) provided in the feedback loop ensure stability of the feedback loop. However, as the number of digital-analog conversion sections increases, so does power consumption of the digital-analog conversion sections in the feedback loop.

In light of the foregoing, it is an object of the present disclosure to provide an analog-digital converter capable of reducing power consumption, a solid-state imaging element using the analog-digital converter, and electronic equipment having the analog-digital converter.

Solution to Problem

An analog-digital converter of the present disclosure for achieving the above object includes a loop filter, a quantization circuit section, and a current steering digital-analog conversion section. The loop filter has at least two cascaded integrators. The quantization circuit section converts a loop filter output into a digital value. The current steering digital-analog conversion section is provided in a feedback loop that feeds back the output of the quantization circuit section to the loop filter. Then, each of the analog-digital converters includes a first input signal current path, a second input signal current path, a first feedback current path, and a second feedback current path. The first input signal current path feeds a first input signal current to an input end of a first stage integrator of the loop filter. The second input signal current path feeds a second input signal current, a current opposite in sign to the first input signal current, to an input end of a second stage integrator of the loop filter. The first feedback current path connects one feedback output end of the current steering digital-analog conversion section to the input end of the first stage integrator of the loop filter. The second feedback current path connects other feedback output end of the current steering digital-analog conversion section to the input end of the second stage integrator of the loop filter.

A solid-state imaging element of the present disclosure for achieving the above object includes a pixel array section and a column processing section. The pixel array section has unit pixels, each including a photoelectric conversion section, arranged in a matrix pattern. The column processing section includes analog-digital converters that convert analog pixel signals, output from the unit pixels, into digital pixel signals. Then, each of the analog-digital converters includes a loop filter, a quantization circuit section, and a current steering digital-analog conversion section. The loop filter has at least two cascaded integrators. The quantization circuit section converts a loop filter output into a digital value. The current steering digital-analog conversion section is provided in a feedback loop that feeds back the output of the quantization circuit section to the loop filter. Each of the analog-digital converters includes a first input signal current path, a second input signal current path, a first feedback current path, and a second feedback current path. The first input signal current path feeds a first input signal current to an input end of a first stage integrator of the loop filter. The second input signal current path feeds a second input signal current, a current opposite in sign to the first input signal current, to an input end of a second stage integrator of the loop filter. The first feedback current path connects one feedback output end of the current steering digital-analog conversion section to the input end of the first stage integrator of the loop filter. The second feedback current path connects other feedback output end of the current steering digital-analog conversion section to the input end of the second stage integrator of the loop filter. Also, electronic equipment of the present disclosure for achieving the above object has the solid-state imaging element configured as described above.

In the analog-digital converter, solid-state imaging element, or electronic equipment configured as described above, the second input signal current path and the second feedback current path are both connected to the input end of the second stage integrator, thus allowing the output current of one side of the current steering digital-analog conversion section and the second input signal current to cancel out each other.

Advantageous Effect of Invention

The present disclosure allows the output current of one side of the current steering digital-analog conversion section and the second input signal current to cancel out each other, thus achieving reduced input level dependence of current consumption while ensuring reduced power consumption. It should be noted that the effect of the present disclosure is not necessarily limited to that recited here and may be any one of the effects recited in the present specification. Also, the effects recited in the present specification are merely illustrative and not restrictive, and there may be additional effects.

DESCRIPTION OF EMBODIMENTS

Figure 1:
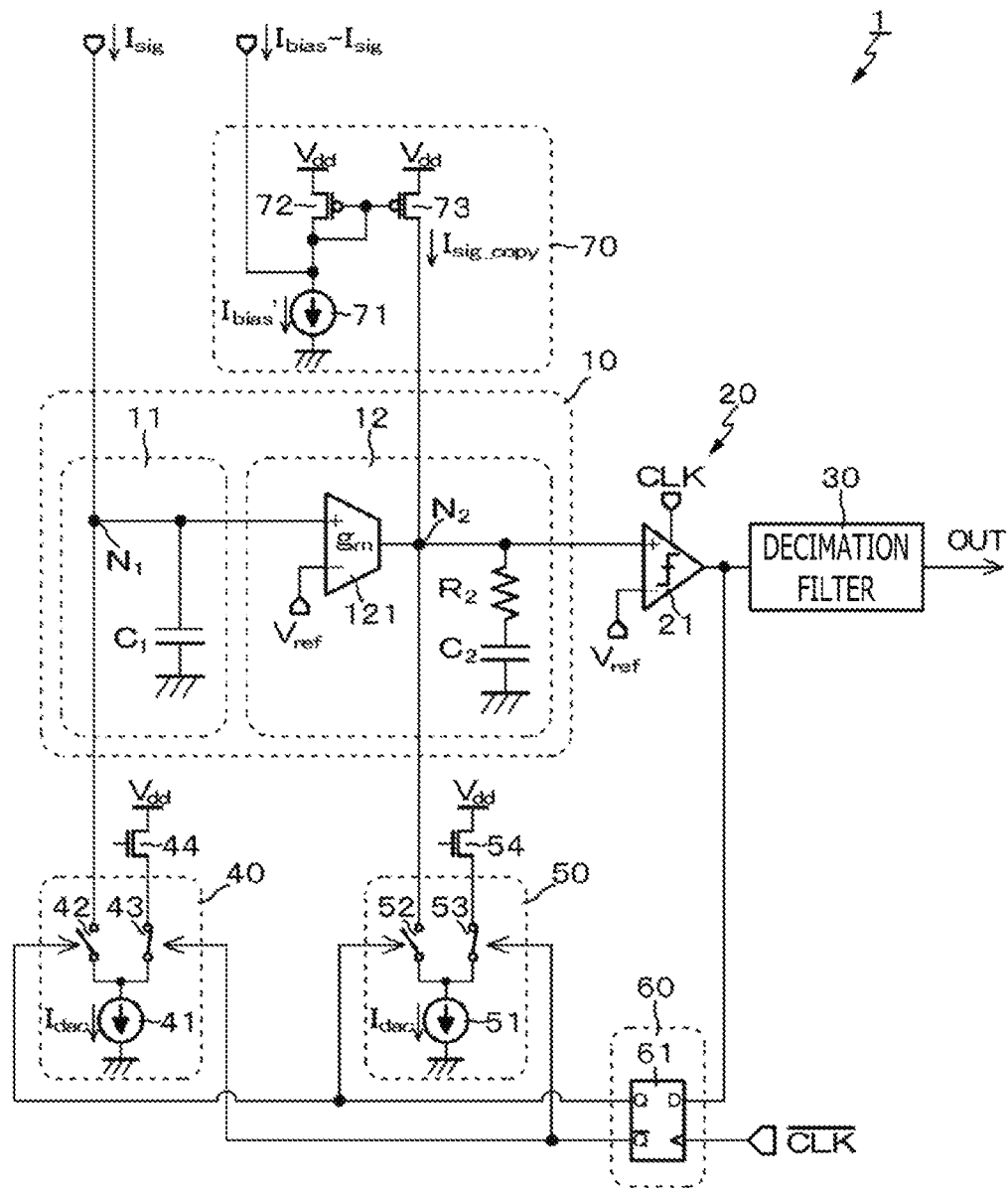
FIG. 1 is a circuit diagram illustrating a circuit configuration of a continuous-time ΔΣ analog-digital converter according to a conventional example 1.

A detailed description will be given below of a mode for carrying out the technology of the present disclosure (hereinafter referred to as an "embodiment") with reference to drawings. The technology of the present disclosure is not limited to the embodiment, and various values in the embodiment are illustrative. In the description given below, the same elements or the elements having the same capabilities will be denoted by the same reference numerals, and redundant description will be omitted. It should be noted that the description will be given in the following order:

1. Description, in general, of the analog-digital converter, the solid-state imaging element, and the electronic equipment of the present disclosure
2. Analog-digital converters of the present disclosure
 2-1. Conventional example 1 (an example of a case in which two digital-analog conversion sections are provided in the feedback loop)
 2-2. Conventional example 2 (an example of a case in which one digital-analog conversion section is provided in the feedback loop)
 2-3. Working example 1 (a basic form of the ΔΣ analog-digital converter according to the present embodiment: an example of a secondary ΔΣ analog-digital converter)
 2-4. Working example 2 (a modification example of the working example 1: an example in which a voltage-current conversion circuit section is provided at the input stage)
 2-5. Working example 3 (a modification example of working example 2: an example in which a differential transconductance amplifier is used as a voltage-current conversion circuit section)
 2-6. Working example 4 (a modification example of a working example 1: an example in which the loop filter includes an active RC integrator)
 2-7. Working example 5 (an example of a tertiary ΔΣ analog-digital converter)
 2-8. Modification example
3. Solid-state imaging element of the present disclosure (an example of a CMOS image sensor)
 3-1. Basic system configuration
 3-2. Stacked structure
4. Electronic equipment of the present disclosure (an example of an imaging apparatus)
5. Possible configurations of the present disclosure <Description, in General, of the Analog-Digital Converter, the Solid-State Imaging Element, and the Electronic Equipment of the Present Disclosure>

In an analog-digital converter, a solid-state imaging element, and electronic equipment of the present disclosure, the second stage integrator of the loop filter can be operated in inverted mode.

The analog-digital converter, the solid-state imaging element, and the electronic equipment including the above preferred configuration can include, at their input stage, a voltage-current conversion circuit section that supplies a first input signal current and a second input signal current. Then, the voltage-current conversion circuit section can include a current source that feeds a bias current and a circuit section that distributes the bias current as the first input signal current and the second input signal current. Alternatively, the voltage-current conversion circuit section can include a differential transconductance amplifier.

Further, in the analog-digital converter, the solid-state imaging element, and the electronic equipment including the above preferred configuration, the loop filter can include an active RC integrator.

Also, in the solid-state imaging element and the electronic equipment including the above preferred configuration, a reset level at the time of resetting of a charge accumulation section and a signal level at the time of photoelectric conversion with a photoelectric conversion element are output as analog pixel signals from a unit pixel. At this time, the voltage-current conversion circuit section can be configured to take the difference between the reset level and the signal level.

<Analog-Digital Converters of the Present Disclosure>

The analog-digital converter of the present disclosure (AD converter) is a ΔΣ analog-digital converter that uses a ΔΣ modulator to convert, at low resolution (one to several bits), a DC current signal or a low-frequency input signal into a digital signal at a high sampling rate. Also, the analog-digital converter according to an embodiment of the present disclosure is a continuous-time ΔΣ analog-digital converter having a current steering digital-analog conversion section (DA conversion section) in a feedback loop. The feedback loop can be stabilized by providing a digital-analog conversion section in the feedback loop.

The continuous-time ΔΣ analog-digital converter according to the present embodiment has, as current inputs, a first input signal and a second input signal opposite in sign (reverse polarity) to the first input signal current. For example, when the first input signal is input as a current $I_{sig}$, the second input signal is input, with respect to a given bias current $I_{bias}$, as an $I_{bias} - I_{sig}$ current.

Before describing the continuous-time ΔΣ analog-digital converter according to the present embodiment, a description will be given below of conventional examples of a ΔΣ analog-digital converter having a digital-analog conversion section in the feedback loop as conventional examples 1 and 2.

Conventional Example 1

Conventional example 1 is a case in which two digital-analog conversion sections are provided in the feedback loop. The circuit configuration of the continuous-time ΔΣ analog-digital converter according to conventional example 1 is illustrated in FIG. 1.

A continuous-time ΔΣ analog-digital converter 1 includes a loop filter 10, a quantization circuit section 20, a decimation filter 30, an example of a digital filter, a first digital-analog conversion section 40, a second digital-analog conversion section 50, and a control circuit section 60. The loop filter 10, the quantization circuit section 20, the first digital-analog conversion section 40, the second digital-analog conversion section 50, and the control circuit section 60 are included in a ΔΣ modulator.

The loop filter 10 is a single-ended loop filter. The loop filter 10 includes, for example, two cascaded integrators, i.e., an integration circuit section having a first stage integrator 11 and a second stage integrator 12. The loop filter 10 integrates the difference between the first input signal current $I_{sig}$, an analog input signal, and a feedback value.

In the loop filter 10, the first stage integrator 11 includes a capacitive element $C_1$ connected between a current input end $N_1$ of the integrator 11 and a reference potential point (e.g., GND). The second stage integrator 12 has a $g_m$ amplifier 121 for converting a voltage into a current, and a resistive element $R_2$ and a capacitive element $C_2$ are connected in series between an output end (current input end of the integrator 12) $N_2$ of the $g_m$ amplifier 121 and the reference potential point (e.g., GND).

The quantization circuit section 20 includes, for example, a comparator 21, quantizes the output of the loop filter 10 by comparing the output of the loop filter 10 with a reference voltage $V_{ref}$, and outputs, for example, a one-bit digital signal. This digital signal is supplied to the decimation filter 30 and the control circuit section 60.

The decimation filter 30 removes quantization noise produced by the ΔΣ modulator that includes the loop filter 10, the quantization circuit section 20, the first digital-analog conversion section 40, the second digital-analog conversion section 50, and the control circuit section 60, performs a process of reducing a sampling frequency through decimation, and outputs a digital signal OUT.

The first digital-analog conversion section 40 and the second digital-analog conversion section 50 are current steering digital-analog conversion sections and provided in the feedback loop of the ΔΣ analog-digital converter 1.

The first digital-analog conversion section 40 includes a differential switching circuit that includes a current source 41 and two switching elements 42 and 43. One ends of the switching elements 42 and 43 are connected together to other end of the current source 41 whose one end is grounded. Other end of the switching element 42 is electrically connected to the current input end $N_1$ of the first stage integrator 11. Other end of the switching element 43 is connected to a node of a supply voltage $V_{dd}$ via a transistor 44. The transistor 44 functions as a load element as a result of application of a given bias voltage to its gate electrode.

The second digital-analog conversion section 50 includes a differential switching circuit that includes a current source 51 and two switching elements 52 and 53 as does the first digital-analog conversion section 40. One ends of the switching elements 52 and 53 are connected together to other end of the current source 51 whose one end is grounded. Other end of the switching element 52 is electrically connected to the current input end $N_2$ of the second stage integrator 12. Other end of the switching element 53 is connected to the node of the supply voltage $V_{dd}$ via a transistor 54. The transistor 54 functions as a load element as a result of application of a given bias voltage to its gate electrode.

The first digital-analog conversion section 40 configured as described above generates, under control of the control section 60, a feedback value proportional to the output of the quantization circuit section 20 and supplies the feedback value to the first stage integrator 11. Also, the second digital-analog conversion section 50 configured as described above generates, under control of the control section 60, a feedback value proportional to the output of the quantization circuit section 20 and supplies the feedback value to the second stage integrator 12.

The control section 60 includes, for example, a D-FF (flip flop) that receives the output of the quantization circuit section 20 at its D input. A D-FF 61 controls the switching element 42 of the first digital-analog conversion section 40 and the switching element 52 of the first digital-analog conversion section 50 to turn on and off with a Q output. The D-FF 61 also controls the switching element 43 of the first digital-analog conversion section 40 and the switching element 53 of the second digital-analog conversion section 50 to turn on and off with an inverted output of the Q output.

The ΔΣ analog-digital converter 1 according to conventional example 1 includes a current generation section 70. The current generation section 70 includes a current source 71 and two P-channel MOS transistors 72 and 73. The current source 71 is connected between a drain electrode of the MOS transistor 72 and the reference potential point (e.g., GND). The MOS transistors 72 and 73 are configured as a current mirror circuit, having their source electrodes connected to the node of the supply voltage $V_{dd}$, their gate electrodes connected together, and the common connection node connected to the drain electrode of the MOS transistor 72. The drain electrode of the MOS transistor 73 is electrically connected to the current input end $N_2$ of the second stage integrator 12.

The current generation section 70 configured as described above generates, as a result of the supply of the second input signal current $I_{bias}-I_{sig}$ to the current source 71, a current $I_{sig\_copy}$ identical to the first input signal current $I_{sig}$ by replicating the second input signal current, supplying the current $I_{sig\_copy}$ to the current input end $N_2$ of the second stage integrator 12. As a result, the same current $I_{sig}$ ($=I_{sig\_copy}$) is input to the first stage integrator 11 and the second stage integrator 12.

As described above, the continuous-time ΔΣ analog-digital converter 1 according to conventional example 1 have a plurality of digital-analog conversion sections such as the two first digital-analog conversion section 40 and second digital-analog conversion section 50 in the feedback loop, ensuring stability of the feedback loop. Then, in the ΔΣ analog-digital converter 1 according to conventional example 1, the copied current $I_{sig\_copy}$ of the first input signal current $I_{sig}$ is also supplied to the second stage integrator 12.

Because the copied current $I_{sig\_copy}$ is supplied to the second stage integrator 12, a balance can be struck with a mean current subtracted from the second stage integrator 12 by the second digital-analog conversion section 50. This makes it possible to suppress an internal signal amplitude of the loop filter 10, effectively providing ease of low supply voltage design and ensuring reduced loss of dynamic range.

In the continuous-time ΔΣ analog-digital converter 1 according to conventional example 1, however, a plurality of digital-analog conversion sections are provided in the feedback loop to stabilize the feedback loop. This leads to increased power consumption of the digital-analog conversion sections. Moreover, the supply of the copied current $I_{sig\_copy}$ to the second stage integrator 12 leads to further increased power consumption of the digital-analog conversion sections.

Conventional Example 2

Figure 2:
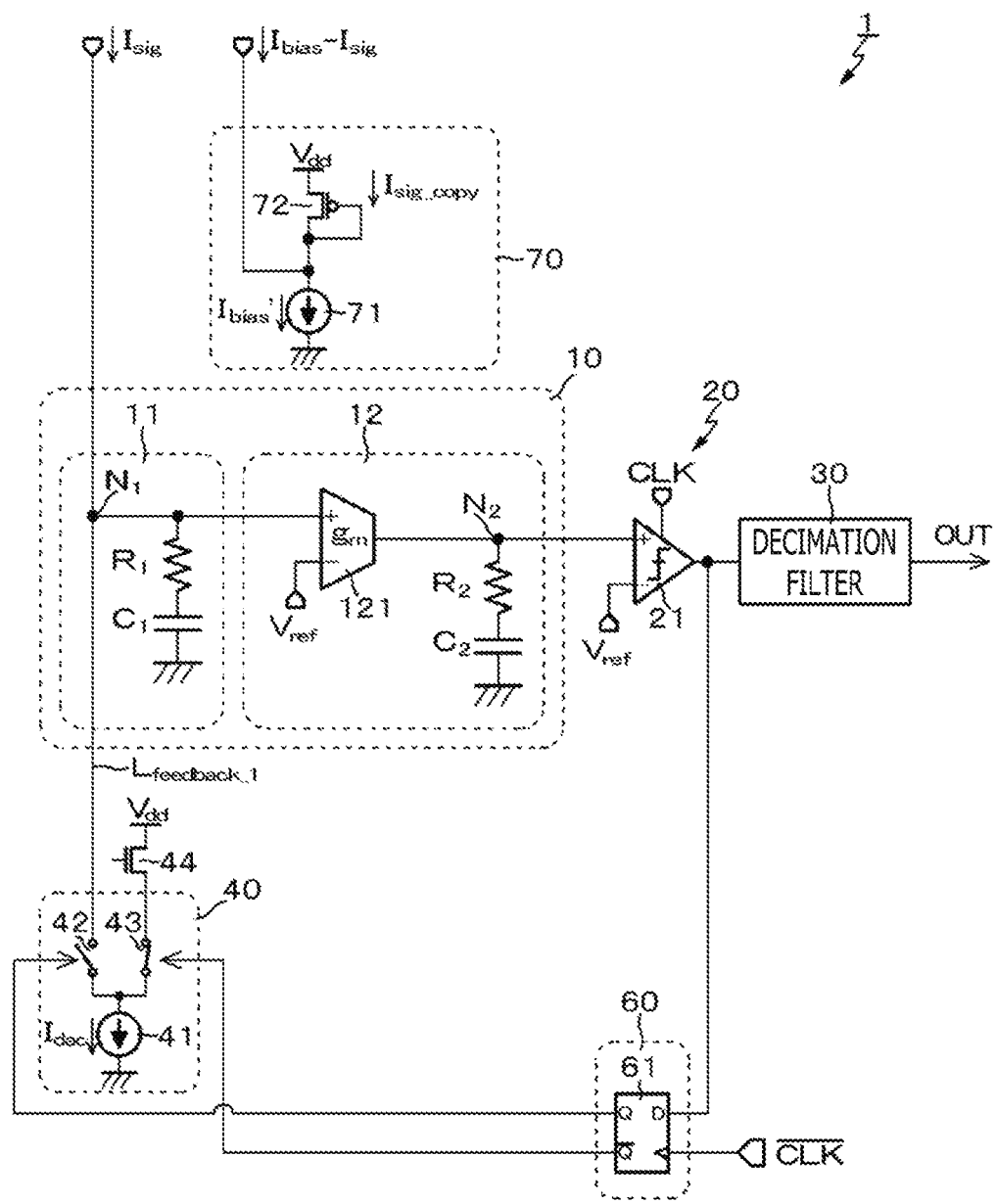
FIG. 2 is a circuit diagram illustrating a circuit configuration of a continuous-time ΔΣ analog-digital converter according to a conventional example 2.

Conventional example 2 is a case in which one digital-analog conversion section is provided in the feedback loop. The circuit configuration of the continuous-time ΔΣ analog-digital converter according to conventional example 2 is illustrated in FIG. 2.

The continuous-time ΔΣ analog-digital converter 1 according to conventional example 2 permits design of a stable loop despite the fact that the single digital-analog conversion section 40 is provided in the feedback loop thanks to the connection of a resistive element $R_1$ in series with the capacitive element $C_1$ included in the first stage integrator 11. This ensures reduced power consumption of the second digital-analog conversion section 50 (refer to FIG. 1) by the amount of current consumption of the second digital-analog conversion section 50 removed.

In the continuous-time ΔΣ analog-digital converter 1 according to conventional example 2, no digital-analog conversion section corresponding to the second stage integrator 12 is provided in the feedback loop. As a result, no current is subtracted from the second stage integrator 12, thus eliminating the need to supply a current to the second stage integrator 12 from the current generation section 70. It should be noted, however, that in the case where the continuous-time ΔΣ analog-digital converter 1 is used, for example, as an analog-digital converter of a column processing section of a CMOS image sensor as will be described later, and if the power consumption of the analog-digital converter has input level dependence, interference will occur with other analog-digital converter via IR drop of power wiring, resulting in image quality deterioration called streaking.

In order to avoid image quality deterioration called streaking, it is necessary to keep the current consumption of the analog-digital converter constant regardless of the input level. From such a viewpoint, the current generation section 70 cannot be completely eliminated from the ΔΣ analog-digital converter 1 according to conventional example 2, and the current generation section 70 includes the current source 71 and the P-channel MOS transistor 72 whose gate electrode and drain electrode are connected together.

In the ΔΣ analog-digital converter 1 according to conventional example 2 configured as described above, a feedback current in the form of a rectangular wave flows through a feedback current path $L_{feedback\_1}$ that connects one feedback end of the digital-analog conversion section 40 and the current input end $N_1$ of the first stage integrator 11. A pulse width and density of the feedback current vary with the input level. The mean current of this feedback current is approximately equal to the input signal current $I_{sig}$.

On the other hand, a current is discarded to the node of the supply voltage $V_{dd}$ from the other feedback output end of the digital-analog conversion section 40. Letting the current of the current source 41 be denoted as $I_{dac}$, the mean current of this discarded current is approximately equal to $(I_{dac}-I_{sig})$. Then, the current consumption of the portion of this discarded current ends up having input level dependence of the ΔΣ analog-digital converter 1, thus resulting in streaking described above.

A possible option for canceling this input level dependence of the current consumption would be to fold the second input signal current $I_{bias}-I_{sig}$, a signal opposite in sign to the first input signal current $I_{sig}$, at the current generation section 70 so as to additionally subtract the second input signal current from the node of the supply voltage $V_{dd}$. However, this method is problematic in that it consumes unnecessary power.

Working Example 1

Figure 3:
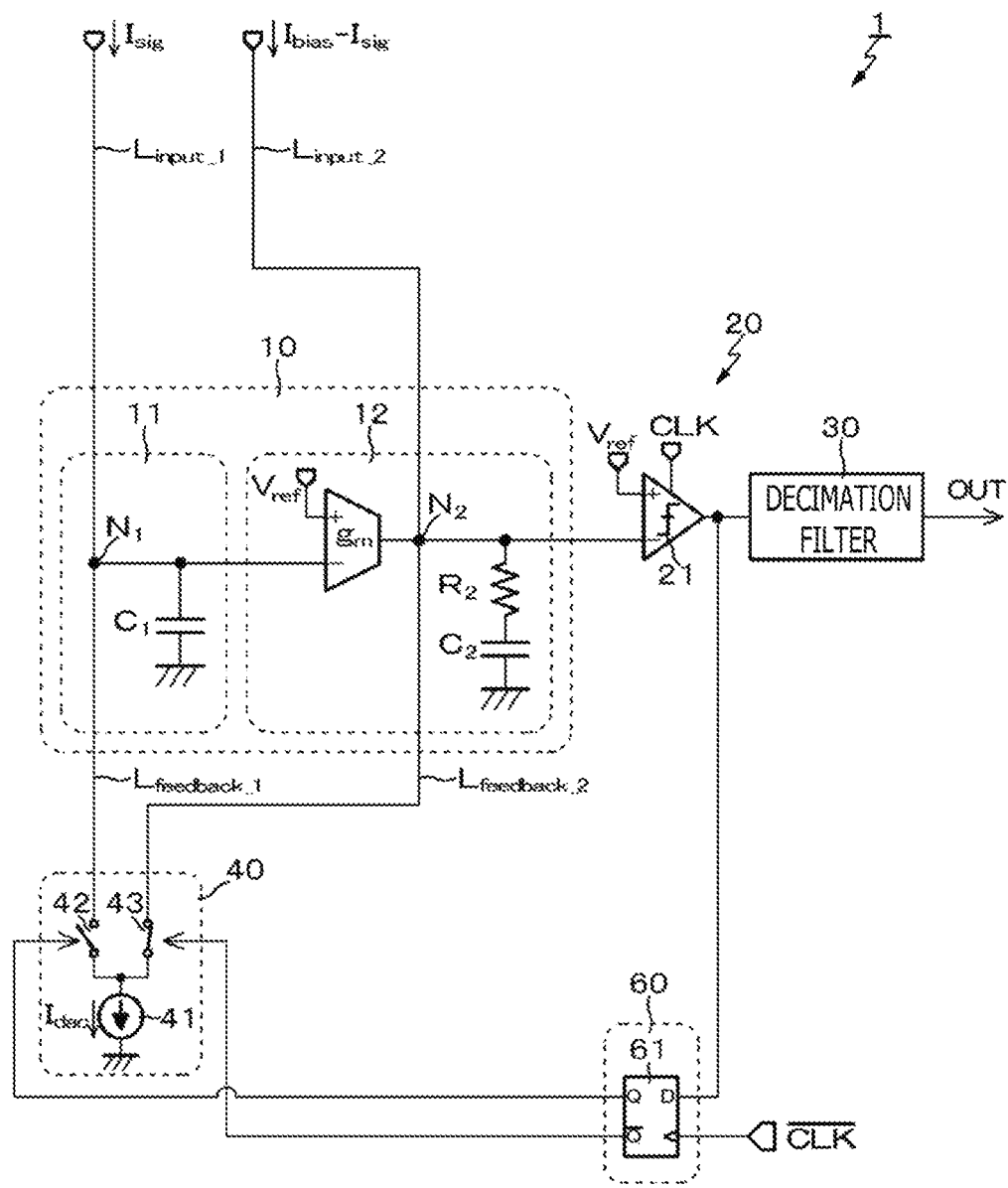
FIG. 3 is a circuit diagram illustrating a circuit configuration of a continuous-time ΔΣ analog-digital converter according to a working example 1.

A working example 1 is a basic form of a continuous-time ΔΣ analog-digital converter according to the present embodiment. Here, the working example 1 will be described by taking, as an example, a secondary ΔΣ analog-digital converter. The circuit configuration of the continuous-time ΔΣ analog-digital converter according to the working example 1 is illustrated in FIG. 3.

The ΔΣ analog-digital converter 1 according to the working example 1 includes the loop filter 10, the quantization circuit section 20, and the decimation filter 30. The loop filter 10 and the quantization circuit section 20 are included in the ΔΣ modulator. The decimation filter 30 is an example of a digital filter. Then, the ΔΣ analog-digital converter 1 is configured such that one digital-analog conversion section 40, and specifically, a current steering digital-analog conversion section, is provided in a feedback loop that feeds the output of the quantization circuit section 20 back to the loop filter 10.

The loop filter 10 includes two integrators, the first stage integrator 11 and the second stage integrator 12. In the loop filter 10, the $g_m$ amplifier 121 included in the second stage integrator 12 receives, as its inverted (−) input, the output of the first stage integrator 11 and, as its non-inverted (+) input, the reference voltage $V_{ref}$. The comparator 21 included in the quantization circuit section 20 receives, as its inverted input, the output of the loop filter 10 and, as its non-inverted input, the reference voltage $V_{ref}$.

In the ΔΣ analog-digital converter 1 according to the working example 1 configured as described above, the first input signal current $I_{sig}$ is supplied to the input end $N_1$ of the first stage integrator 11 of the loop filter 10 through a first input signal current path $L_{input}$. The second input signal current a signal opposite in sign to the first input signal current $I_{sig}$, is supplied to the current input end $N_2$ of the second stage integrator 12 of the loop filter 10 through a second input signal current path $L_{input\_2}$.

Also, one of the feedback output ends of the current steering digital-analog conversion section 40, i.e., the other end of the switching element 42, is connected to the input end $N_1$ of the first stage integrator 11 of the loop filter 10 through a first feedback current path $L_{feedback\_1}$. The other feedback output end of the current steering digital-analog conversion section 40, i.e., the other end of the switching element 43, is connected to the current input end $N_2$ of the second stage integrator 12 of the loop filter 10 through a second feedback current path $L_{feedback\_2}$.

As described above, the ΔΣ analog-digital converter 1 according to the working example 1 is configured such that the second input signal current path $L_{input\_2}$ through which a second input signal current flows and the second feedback current path $L_{feedback\_2}$ through which the output current on one side of the digital-analog conversion section 40 (side of the other feedback output end) flows are both connected to the current input end $N_2$ of the second stage integrator 12.

Letting the bias component $I_{bias}$ of the second input signal current be denoted as $I_{bias}=I_{dac}$, the mean value of the current flowing through the second input signal current path $L_{input\_2}$ and the mean value of the current flowing through the second feedback current path $L_{feedback\_2}$ are both opposite in sign to the first input signal current $I_{sig}$ and approximately the same. Therefore, a balance can be struck in terms of current.

At this time, a signal opposite in sign to that input in the case of conventional examples 1 and 2 is input to the second stage integrator 12 to which the second input signal current path $L_{input\_2}$ and the second feedback current path $L_{feedback\_2}$ are connected. For this reason, the output of the first stage integrator 11 is supplied to the inverted input of the $g_m$ amplifier 121, and the output of the loop filter 10 is supplied to the inverted input of the comparator 21, as described above. Then, only the second stage integrator 12, as a whole, is operated in reverse polarity, i.e., in inverted mode, thus making it possible to maintain ΔΣ characteristics such as stability.

By the way, one possible technique would be to connect the second input signal current path $L_{input\_2}$ and the second feedback current path $L_{feedback\_2}$ together but not to connect them to the loop filter 10. However, this technique has the following two problems. Firstly, even if the current flowing through the second input signal current path $L_{input\_2}$ and that flowing through the second feedback current path $L_{feedback\_2}$ are, on the average, in balance, these two currents are momentarily different, thus resulting in imbalance. Secondly, even if a match is achieved between these currents in terms of design, in reality, a mismatch occurs, causing the voltage at the connection point to be added to the ground voltage or the supply voltage and preventing the circuit from functioning properly.

From such a viewpoint, the technique employed in the working example 1, namely, connecting the second input signal current path $L_{input\_2}$ and the second feedback current path $L_{feedback\_2}$ together and connecting them to the loop filter 10, is preferred. Incorporating the common connection point between the second input signal current path $L_{input\_2}$ and the second feedback current path $L_{feedback\_2}$ into the loop filter 10 as described above allows the above mismatch and momentary difference in current to be accommodated thanks to feedback, keeping the voltage at the common connection point within a given range.

As described above, in the ΔΣ analog-digital converter 1 according to the working example 1, the second input signal current path $L_{input\_2}$ and the second feedback current path $L_{feedback\_2}$ are both connected to the input end $N_2$ of the second stage integrator 12. As a result, the output current on one side of the digital-analog conversion section 40 (side of the other feedback output end) and the second input signal current cancel out each other, thus ensuring reduced power consumption. Also, the input level dependence of current consumption is significantly reduced, thus achieving higher constancy of current.

Working Example 2

Figure 4:
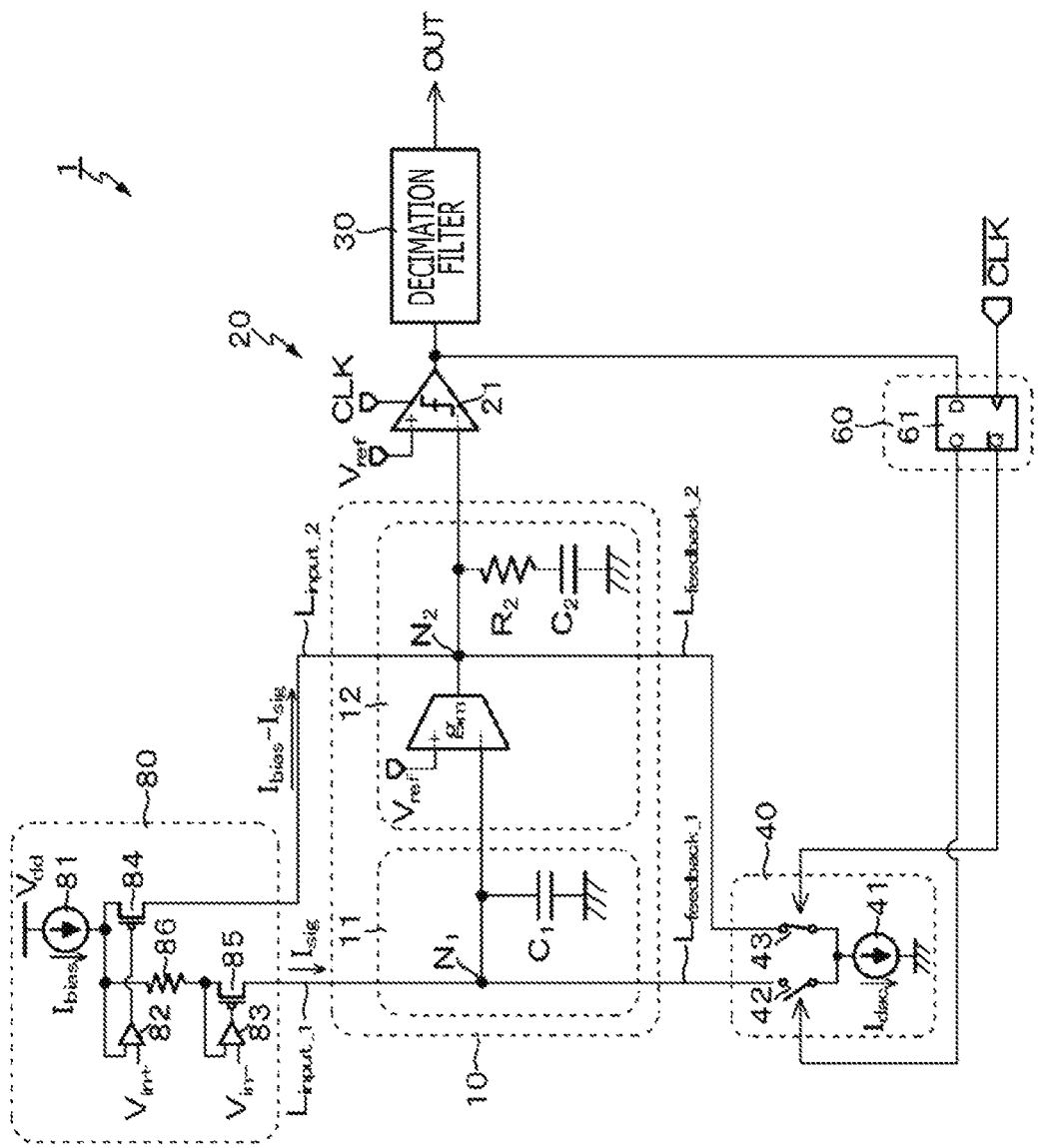
FIG. 4 is a circuit diagram illustrating a circuit configuration of a continuous-time ΔΣ analog-digital converter according to a working example 2.

A working example 2 is a modification example of the working example 1 in which a voltage-current conversion circuit section is provided at the input stage of the ΔΣ analog-digital converter. The circuit configuration of the continuous-time ΔΣ analog-digital converter according to the working example 2 is illustrated in FIG. 4.

The continuous-time ΔΣ analog-digital converter 1 according to the working example 2 has a voltage-current conversion circuit section 80 at its input stage. The voltage-current conversion circuit section 80 includes a current source 81, two buffer amplifiers 82 and 83, two P-channel MOS transistors 84 and 85, and a resistive element 86 and is configured to distribute the bias current $I_{bias}$.

In the voltage-current conversion circuit section 80, the current source 81 has one of its ends connected to the node of the supply voltage $V_{dd}$ and feeds the bias current $I_{bias}$. The buffer amplifier 82 receives a first input voltage $V_{in+}$ as its input and has its output end connected to the gate electrode of the P-channel MOS transistor 84. The buffer amplifier 83 receives a second input voltage $V_{in-}$ as its input and has its output end connected to the gate electrode of the P-channel MOS transistor 85.

The P-channel MOS transistor 84 has its source electrode connected to the other end of the current source 81 and supplies the second input signal current $I_{bias}-I_{sig}$ to the second input signal current path $L_{input\_2}$. The P-channel MOS transistor 85 has its source electrode connected to the other end of the current source 81 via the resistive element 86 and supplies the first input signal current $I_{sig}$ to the first input signal current path $L_{input\_1}$.

The components other than the voltage-current conversion circuit section 80 provided at the input stage, i.e., the loop filter 10, the quantization circuit section 20, the decimation filter 30, the first digital-analog conversion section 40, and the control circuit section 60, are basically the same as in the case of the working example 1. Therefore, the ΔΣ analog-digital converter 1 according to the working example 2 also ensures reduced power consumption and has significantly reduced input level dependence of current consumption for higher constancy of current as in the case of the working example 1.

Working Example 3

Figure 5:
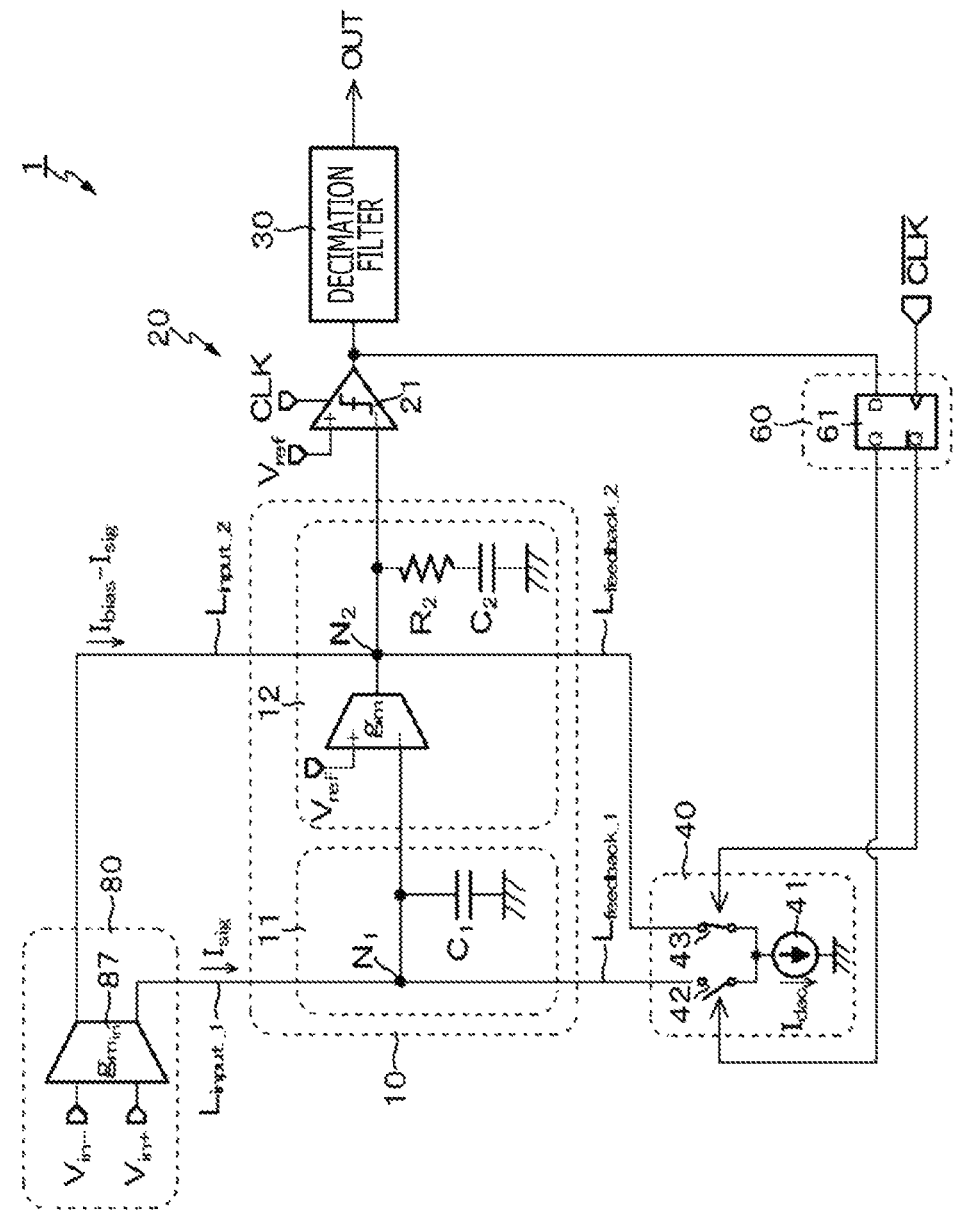
FIG. 5 is a circuit diagram illustrating a circuit configuration of a continuous-time ΔΣ analog-digital converter according to a working example 3.

A working example 3 is a modification example of the working example 2 in which a differential transconductance amplifier is used as a voltage-current conversion circuit section. The circuit configuration of the continuous-time ΔΣ analog-digital converter according to the working example 3 is illustrated in FIG. 5.

The continuous-time ΔΣ analog-digital converter 1 according to the working example 3 uses a differential transconductance amplifier 87 as the voltage-current conversion circuit section 80 rather than the voltage-current conversion circuit section 80 of the working example 2. The differential transconductance amplifier 87 receives the first input voltage $V_{in+}$ and the second input voltage $V_{in-}$ as its inputs, supplies the first input signal current $I_{sig}$ to the first input signal current path $L_{input\_1}$ and supplies the second input signal current $I_{bias}-I_{sig}$ to the second input signal current path $L_{input\_2}$.

The components other than the voltage-current conversion circuit section 80 that uses the differential transconductance amplifier 87 and is provided at the input stage, i.e., the loop filter 10, the quantization circuit section 20, the decimation filter 30, the digital-analog conversion section 40, and the control circuit section 60, are basically the same as in the case of the working example 1. Therefore, the ΔΣ analog-digital converter 1 according to the working example 3 also ensures reduced power consumption and has significantly reduced input level dependence of current consumption for higher constancy of current as in the case of the working example 1.

Working Example 4

Figure 6:
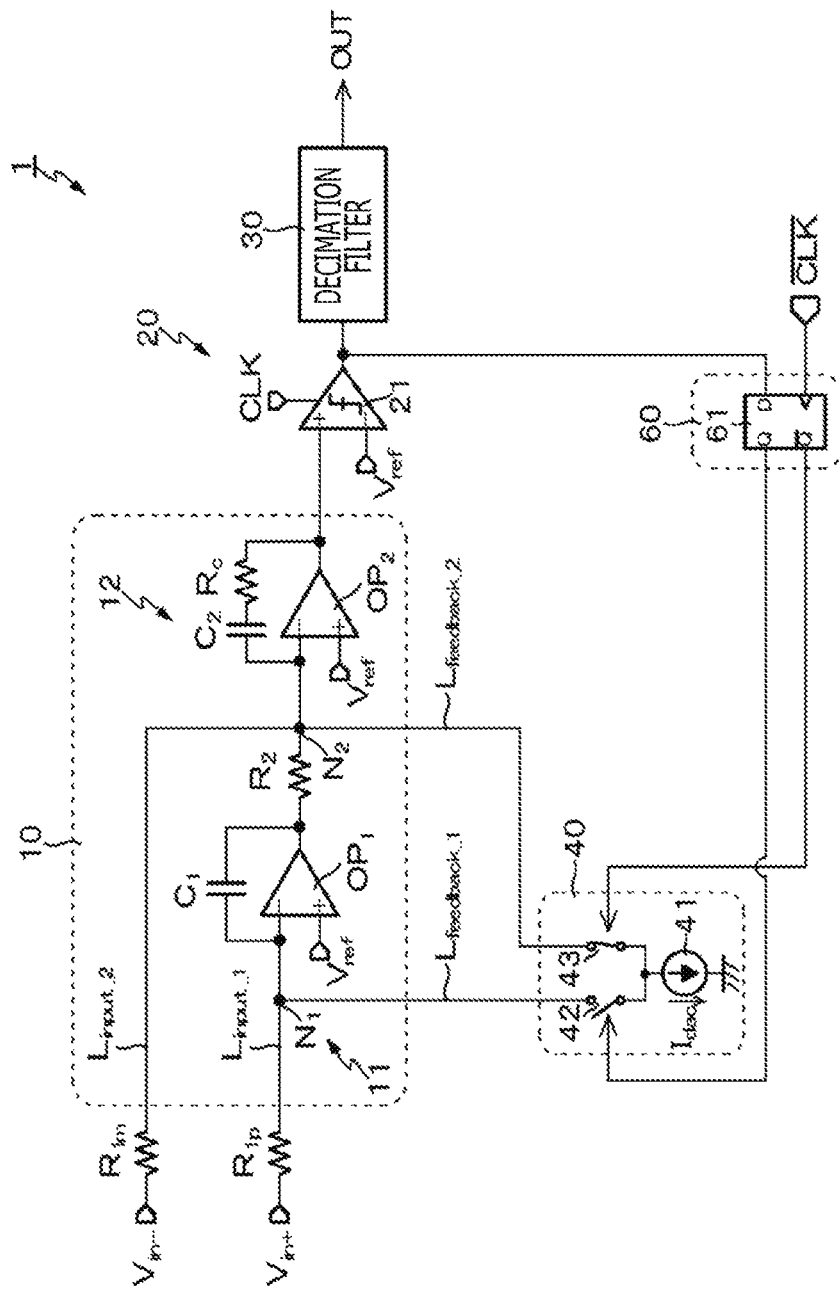
FIG. 6 is a circuit diagram illustrating a circuit configuration of a continuous-time ΔΣ analog-digital converter according to a working example 4.

A working example 4 is a modification example of the working example 1 in which the loop filter includes an active RC integrator. The circuit configuration of the continuous-time ΔΣ analog-digital converter according to the working example 4 is illustrated in FIG. 6.

In the continuous-time ΔΣ analog-digital converter 1 according to the working example 4, the loop filter 10 includes an active RC integrator. The loop filter 10 is supplied with the first input voltage $V_{in+}$ through a resistive element $R_{1p}$ and the second input voltage $V_{in-}$ through a resistive element Rim.

The first input voltage $V_{in+}$ is supplied, by way of the resistive element $R_{1p}$, to the current input end $N_1$ of the first stage integrator 11 as the first input signal current $I_{sig}$ by the first input signal current path $L_{input}$. The second input voltage $V_{in-}$ is supplied, by way of the resistive element Rim, to the current input end $N_2$ of the second stage integrator 12 as the second input signal current $I_{bias}-I_{sig}$ by the second input signal current path $L_{input\_2}$.

The first stage integrator 11 has a circuit configuration using an operational amplifier $OP_1$. The operational amplifier $OP_1$ receives, at its inverted (−) input end, the first input signal current $I_{sig}$ through the resistive element $R_{1p}$ and a feedback current through the first feedback current path $L_{feedback\_1}$. The operational amplifier $OP_1$ receives the reference voltage $V_{ref}$ at its non-inverted (+) input end. Also, the capacitive element $C_1$ is connected between the inverted input end and the output end of the operational amplifier $OP_{1m}$.

The second stage integrator 12 has a circuit configuration using an operational amplifier $OP_2$. The operational amplifier $OP_2$ receives, at its inverted input end, the output of the first stage integrator 11 through the resistive element $R_2$, the second input signal current $I_{bias}-I_{sig}$ through the resistive element Rim, and the feedback current through the second input signal current path $L_{input\_2}$. The operational amplifier $OP_2$ receives the reference voltage $V_{ref}$ at its non-inverted input end. Also, the capacitive element $C_2$ and a resistive element $R_c$ are connected between the inverted input end and the output end of the operational amplifier $OP_2$.

The components other than the loop filter 10 that includes an active RC integrator, i.e., the quantization circuit section 20, the decimation filter 30, the digital-analog conversion section 40, and the control circuit section 60, are basically the same as in the case of the working example 1. Therefore, the ΔΣ analog-digital converter 1 according to a working example 5 also ensures reduced power consumption and has significantly reduced input level dependence of current consumption for higher constancy of current as in the case of the working example 1.

The technology of the working example 4 is also applicable to the continuous-time ΔΣ analog-digital converters 1 according to the working examples 1 to 3.

Working Example 5

Figure 7:
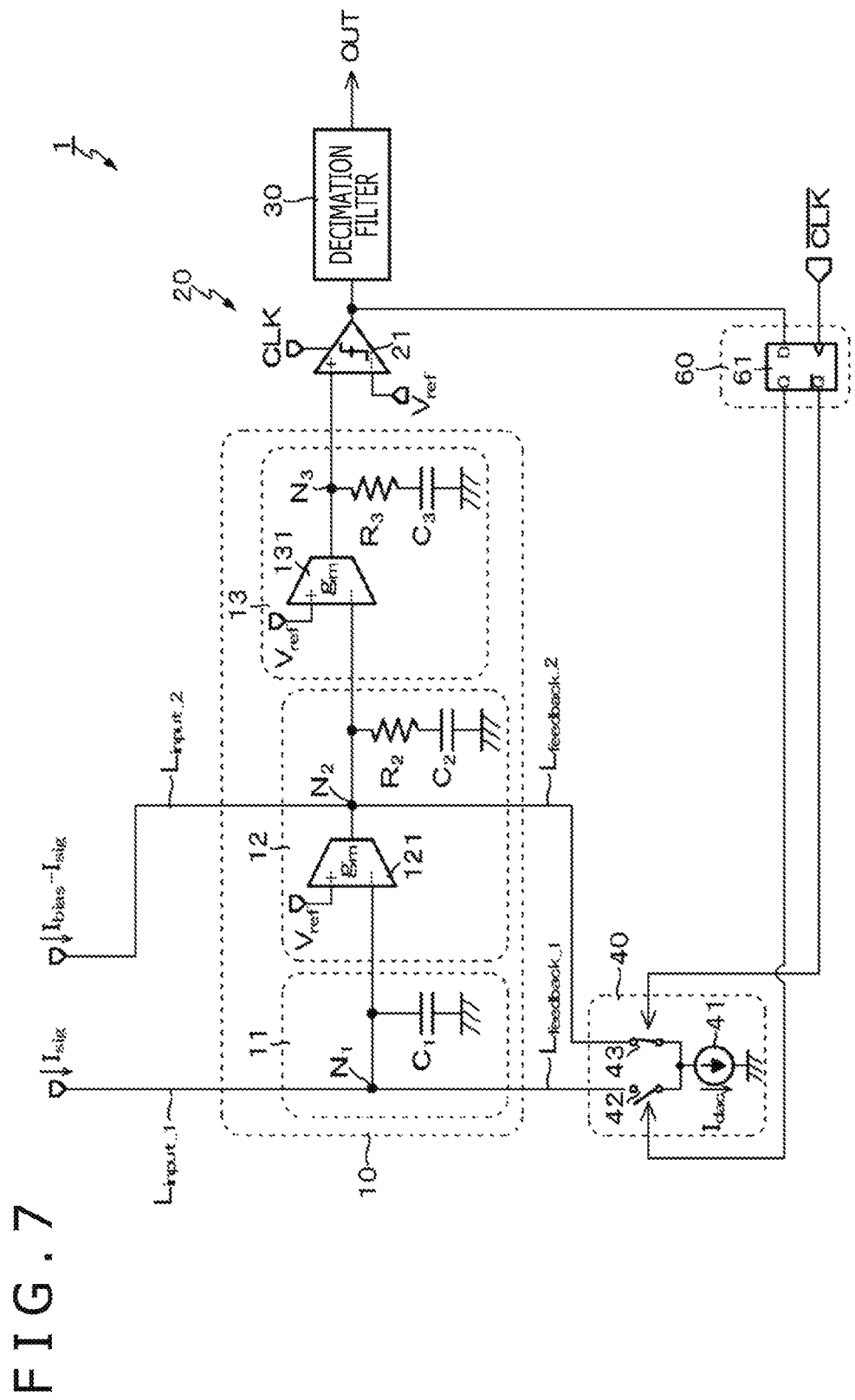
FIG. 7 is a circuit diagram illustrating a circuit configuration of a continuous-time ΔΣ analog-digital converter according to a working example 5.

A Working example 5 is an example of a tertiary ΔΣ analog-digital converter. The circuit configuration of the continuous-time ΔΣ analog-digital converter according to the working example 5 is illustrated in FIG. 7.

In the ΔΣ analog-digital converter 1 according to the working example 5, the first stage integrator 11 and the second stage integrator 12 are identical in circuit configuration to those of the working example 1. It should be noted, however, that the first stage integrator 11 and the second stage integrator 12 are not limited to these circuit configurations. For example, the first stage integrator 11 and the second stage integrator 12 may include the operational amplifier $OP_1$ and the operational amplifier $OP_2$ in their circuit configurations as in the working example 4.

A third stage integrator 13 has a $g_m$ amplifier 131, and a resistive element $R_3$ and a capacitive element $C_3$ are connected in series between an output end $N_3$ of the $g_m$ amplifier 131 and the reference potential point (e.g., GND).

The components other than the loop filter 10 that includes the three stage integrators 11, 12, and 13, i.e., the quantization circuit section 20, the decimation filter 30, the digital-analog conversion section 40, and the control circuit section 60, are basically the same as in the case of the working example 1. Therefore, the ΔΣ analog-digital converter 1 according to the working example 5 also ensures reduced power consumption and has significantly reduced input level dependence of current consumption for higher constancy of current as in the case of the working example 1.

The ΔΣ analog-digital converters 1 according to the working examples 1 to 5 described above permit reduction in number of digital-analog conversion sections provided in the feedback loop and unnecessary current sources as compared to conventional example 1, thus contributing to reduced circuit area and reduced costs. Also, the current flowing through the second input signal current path $L_{input\_2}$ and the current flowing through the second feedback current path $L_{feedback\_2}$ are in balance on the average, thus achieving an excellent current balance in the loop filter 10 and avoiding unnecessary increase in inner amplitude. This provides improved response to low supply voltage, thus keeping the loss of dynamic range to a minimum. Then, these effects can be realized without consuming unnecessary power.

Modification Example

In the above the working examples 1 to 5, cases were described in which the technology of the present disclosure was applied to one-bit ΔΣ analog-digital converters. However, the technology of the present disclosure is not limited in application to one-bit ΔΣ analog-digital converters. That is, the technology of the present disclosure is similarly applicable to multi-bit ΔΣ analog-digital converters.

<Solid-State Imaging Element of the Present Disclosure>
[Basic System Configuration]

Figure 8:
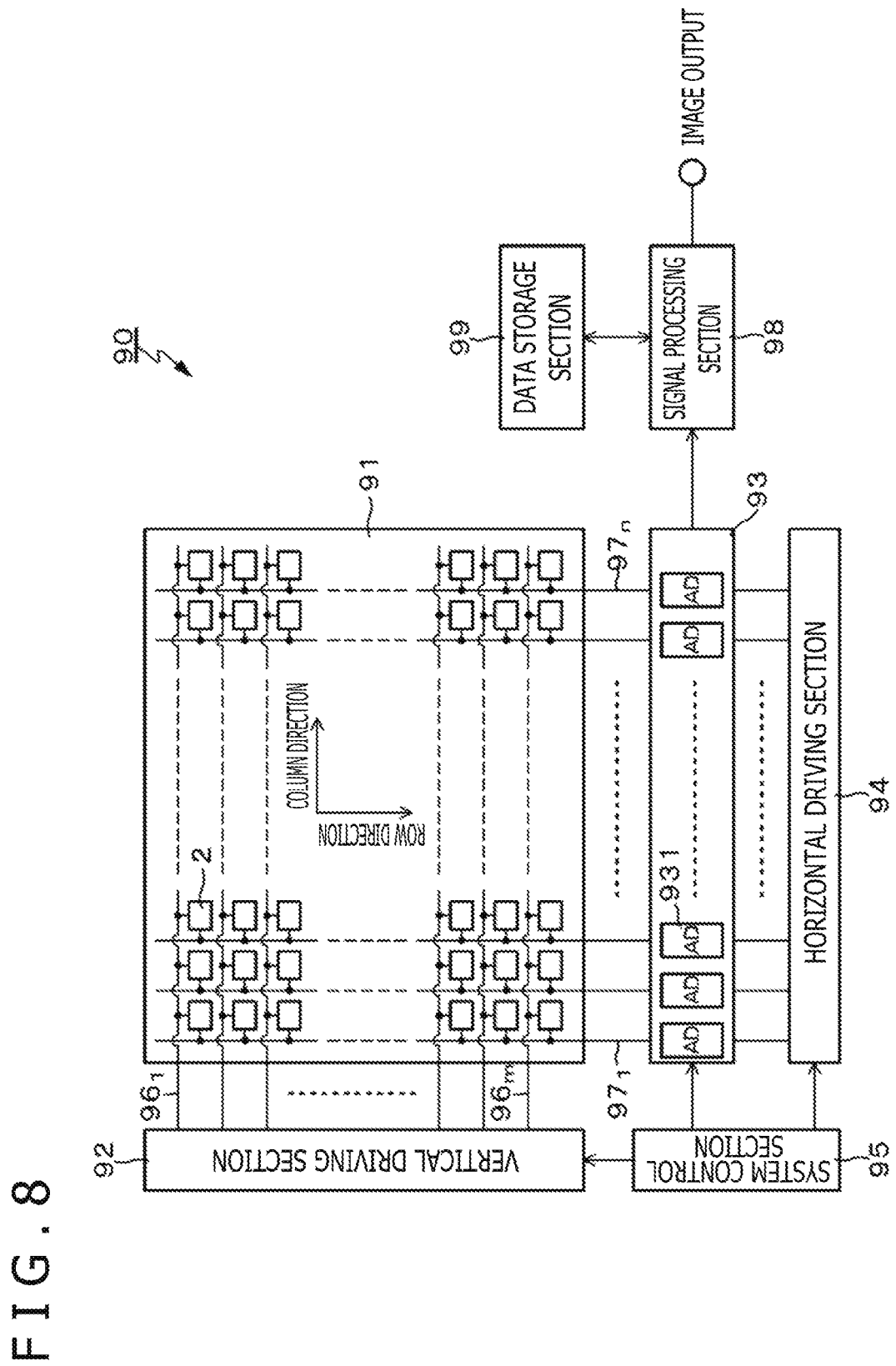
FIG. 8 is a schematic configuration diagram illustrating a basic system configuration of a solid-state imaging element of the present disclosure.

FIG. 8 is a schematic configuration diagram illustrating a basic system configuration of a solid-state imaging element of the present disclosure. A description will be given here by taking, as an example, a CMOS image sensor, a type of an X-Y addressing solid-state imaging element, as a solid-state imaging element. A CMOS image sensor refers to an image sensor manufactured by using a CMOS process or partially using the process.

A CMOS image sensor 90 according to the present example has a pixel array section 91 and a peripheral circuit section. The pixel array section 91 is formed on a semiconductor substrate (chip) which is not illustrated. The peripheral circuit section is integrated on the same semiconductor substrate as the pixel array section 91. The peripheral circuit section includes, for example, a vertical driving section 92, a column processing section 93, a horizontal driving section 94, and a system control section 95.

The CMOS image sensor 90 further includes a signal processing section 98 and a data storage section 99. The signal processing section 98 and the data storage section 99 may be mounted on the same substrate as the CMOS image sensor 90 or on a different substrate from that of the CMOS image sensor 90. Also, processes of the signal processing section 98 and the data storage section 99 may be performed, for example, by an external signal processing section such as DSP (Digital Signal Processor) circuit provided on the different substrate from that of the CMOS image sensor 90 or by software.

The pixel array section 91 has unit pixels (hereinafter may be simply referred to as "pixels") arranged in row and column directions, i.e., in a matrix pattern. Each of the unit pixels includes a photoconversion section that generates photocharge proportional to the amount of light received through photoelectric conversion and accumulates photocharge. Here, the row direction refers to the direction of arrangement of pixels of pixel rows (so-called horizontal direction), and the column direction refers to the direction of arrangement of pixels of pixel columns (so-called vertical direction).

The pixel array section 91 has pixel driving lines 96 (961 to 96*m*) laid out, one for each pixel row, in the row direction and vertical signal lines 97 (971 to 97*n*) laid out, one for each pixel column, in the column direction for the pixels arranged in a matrix pattern. The pixel driving lines 96 transfer drive signals which will be described later for driving the pixels to read out signals therefrom. Although illustrated as a single wire in FIG. 8, the pixel driving line 96 is not limited to a single line. One end of the pixel driving line 96 is connected to the output end of the corresponding row of the vertical driving section 92.

The vertical driving section 92 includes shift registers and address decoders and drives all the pixels 2 of the pixel array section 91 at the same time, one row at a time, or in other manner. That is, the vertical driving section 92 is included in a driving section together with the system control section 95 that controls the vertical driving section 92. The driving section drives each of the pixels 2 of the pixel array section 91. Although the specific configuration of the vertical driving section 92 is not illustrated, the vertical driving section 92 generally has two scan systems, a readout scan system and a sweep scan system.

The readout scan system selectively scans the unit pixels 2 of the pixel array section 91 row by row. Signals read out from the unit pixels 2 are analog signals. The sweep scan system performs a sweep scan on a readout row to be subjected to a readout scan a shutter speed time earlier than the readout scan.

This sweep scan by the sweep scan system causes unnecessary charge to be swept from the photoelectric conversion sections of the unit pixels 2 of the readout row, thus resetting the photoelectric conversion sections. Then, so-called electronic shutter operation is performed as a result of sweeping of unnecessary charge by the sweep scan system (resetting). Here, the electronic shutter operation refers to operation involving discarding photocharge of the photoconversion sections and initiating exposure again (initiating accumulation of photocharge).

The signals read out by the readout operation of the readout scan system correspond to the amount of light received after the immediately previous readout operation or the electronic shutter operation. Then, a time period from the readout timing of the immediately previous readout operation or the sweep timing of the electronic shutter operation to the readout timing of the current readout operation is an exposure period of photocharge in the unit pixels 2.

The signal output from each of the pixels 2 of the pixel row selectively scanned by the vertical driving section 92 is input to the column processing section 93 through one of the vertical signal lines 97 for each of the pixel columns.

The column processing section 93 has analog-digital converters (AD converters) 931, one for each pixel column of the pixel array section 91 or one for each plurality of pixel columns. The analog-digital converters 931 convert analog pixel signals output through the vertical signal lines 97 from the respective pixels 2 of the selected row into digital signals.

The horizontal driving section 94 includes shift registers and address decoders and selectively scans, in sequence, unit circuits, each corresponding to one pixel column of the column processing section 93 or to each plurality of pixel columns. This selective scan by the horizontal driving section 94 allows pixel signals, AD converted or processed in other manner for each unit circuit in the column processing section 93, to be output in sequence.

The system control section 95 includes a timing generator or other component for generating various timing signals and controls the vertical driving section 92, the column processing section 93, the horizontal driving section 94, and other components on the basis of various timings generated by the timing generator.

The signal processing section 98 has at least a computational processing capability, handling various types of signal processing tasks including computational processing on the pixel signals output from the column processing section 93. The data storage section 99 temporarily stores data required for signal processing performed by the signal processing section 98.

In the CMOS image sensor 90 configured as described above, the $\Delta\Sigma$ analog-digital converters 1 according to the working examples 1 to 5 can be used as the analog-digital converters 931 that are provided one for each pixel column of the pixel array section 91 or one for each plurality of pixel columns in the column processing section 93.

The $\Delta\Sigma$ analog-digital converters 1 according to the working examples 1 to 5 ensure reduced power consumption. Therefore, it is possible to reduce power consumption of the analog-digital converters 931 and, by extension, that of the CMOS image sensor 90, by using the $\Delta\Sigma$ analog-digital converters 1 according to the working examples 1 to 5 as the analog-digital converters 931.

Also, the $\Delta\Sigma$ analog-digital converters 1 according to the working examples 1 to 5 have significantly reduced input level dependence of current consumption, thus achieving higher constancy of current. Therefore, it is possible to suppress interference (streaking) with other analog-digital converter via IR drop of power wiring by using the $\Delta\Sigma$ analog-digital converters 1 according to the working examples 1 to 5 as the analog-digital converters 931.

Incidentally, in the CMOS image sensor 90, a noise removal process is generally performed through correlated double sampling (CDS) to remove noise during reset operation of the unit pixels 2. A reset level (P phase) and a signal level (D phase) are read out in this order from the unit pixels 2. The reset level is correspond to the potential of a charge accumulation section (floating diffusion) of the unit pixel 2 when the charge accumulation section is reset. The signal level is correspond to the potential acquired by photoelectric conversion of the photoelectric conversion element, i.e., the potential of the charge accumulation section when the charge accumulated in the photoelectric conversion element is transferred to the charge accumulation section.

In the readout scheme that reads out the reset level first, random noise that occurs at the time of reset is held by the charge accumulation section. As a result, the signal level read out with signal charge added thereto holds the same amount of noise as the reset level. For this reason, the correlated double sampling operation that subtracts the reset level from the signal level provides a signal free from such noise.

In the CMOS image sensor 90 configured as described above, not only the analog-digital conversion operation but also the correlated double sampling operation can be performed in the analog-digital converter 931 by using the ΔΣ analog-digital converter 1 according to the working example 2 or 3 as the analog-digital converter 931. Specifically, in the case of the example illustrated in FIG. 4 (the working example 2), the correlated double sampling operation can be realized by inputting the reset level (P phase) as the first input voltage $V_{in+}$ and the signal level (D phase) as the second input voltage $V_{in-}$. Also, in the case of the example illustrated in FIG. 5 (the working example 3), the correlated double sampling operation can be realized by inputting the signal level (D phase) as the first input voltage $V_{in+}$ and the reset level (P phase) as the second input voltage $V_{in-}$.

It should be noted that the system configuration of the CMOS image sensor 90 described above is merely an example, and the CMOS image sensor 90 is not limited thereto in system configuration. For example, the CMOS image sensor 90 may have a system configuration in which the data storage section 99 is provided at the subsequent stage of the column processing section 93 and in which the pixel signals output from the column processing section 93 are supplied to the signal processing section 98 by way of the data storage section 99. Alternatively, the CMOS image sensor 90 may have a system configuration in which the data storage section 99 and the signal processing section 98 are provided in parallel relative to the column processing section 93.

[Stacked Structure]

Figure 9:
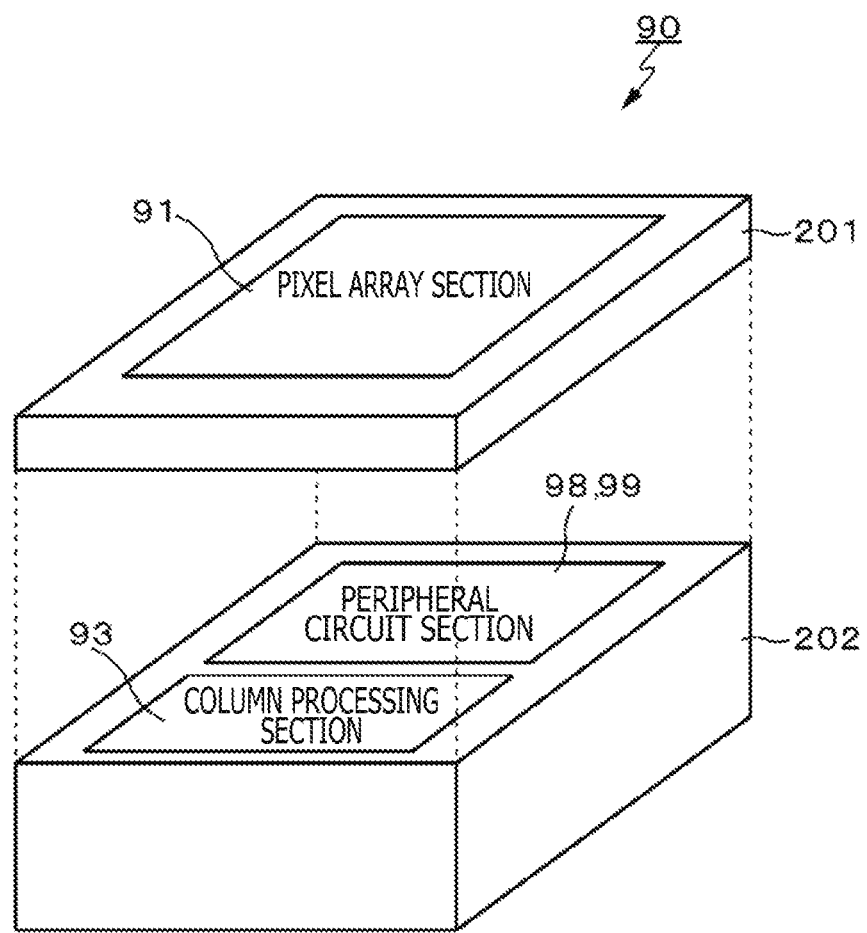
FIG. 9 is an exploded perspective view schematically illustrating a configuration of a CMOS image sensor having a stacked structure.

Also, although the CMOS image sensor 90 was described above by taking, as an example, a CMOS image sensor having a so-called flat structure in which the peripheral circuit sections such as the column processing section 93 including the analog-digital converters 931 and the signal processing section 98 are formed on the same semiconductor substrate as the pixel array section 91, the present disclosure is not limited in application to CMOS image sensors having a flat structure. That is, the present disclosure is also applicable to a CMOS image sensor having a so-called stacked structure in which a plurality of semiconductor substrates are stacked one on top of the other. A specific example of a stacked structure is that in which a semiconductor substrate 201 with the pixel array section 91 formed thereon and a semiconductor substrate 202 with the column processing section 93 including the analog-digital converters 931, the signal processing section 98, the data storage section 99, and so on formed thereon are stacked one on top of the other as illustrated in FIG. 9.

The CMOS image sensor 90 having this stacked structure need only have a size (area) that allows formation of the pixel array section 91, thus contributing to a reduced size (area) of the first-layer semiconductor substrate 201, and by extension, a reduced chip size as a whole. Further, it is possible to apply a process suitable for fabricating pixels to the first-layer semiconductor substrate 201 and a process suitable for fabricating circuits to the second-layer semiconductor substrate 202. This permits process optimization, an advantage, in the manufacture of the CMOS image sensor 90.

It should be noted that although a two-layer stacked structure has been illustrated here, the stacked structure is not limited to two layers and may have three or more layers.

<Electronic Equipment of the Present Disclosure>

The solid-stage imaging element of the present disclosure described above can be used as an imaging section (image capture section) of an imaging apparatus such as digital still camera or video camera, a mobile terminal apparatus having an imaging capability such as mobile phone, and electronic equipment in general such as copier that employs a solid-state imaging element as its image reading section. It should be noted that the solid-state imaging element may be a single chip or in a modular form having an imaging capability with its imaging section and signal processing section or an optics packaged together. Alternatively, there is a case in which the modular form mounted to electronic equipment, i.e., a camera module, may be used as an imaging apparatus.

[Imaging Apparatus]

Figure 10:
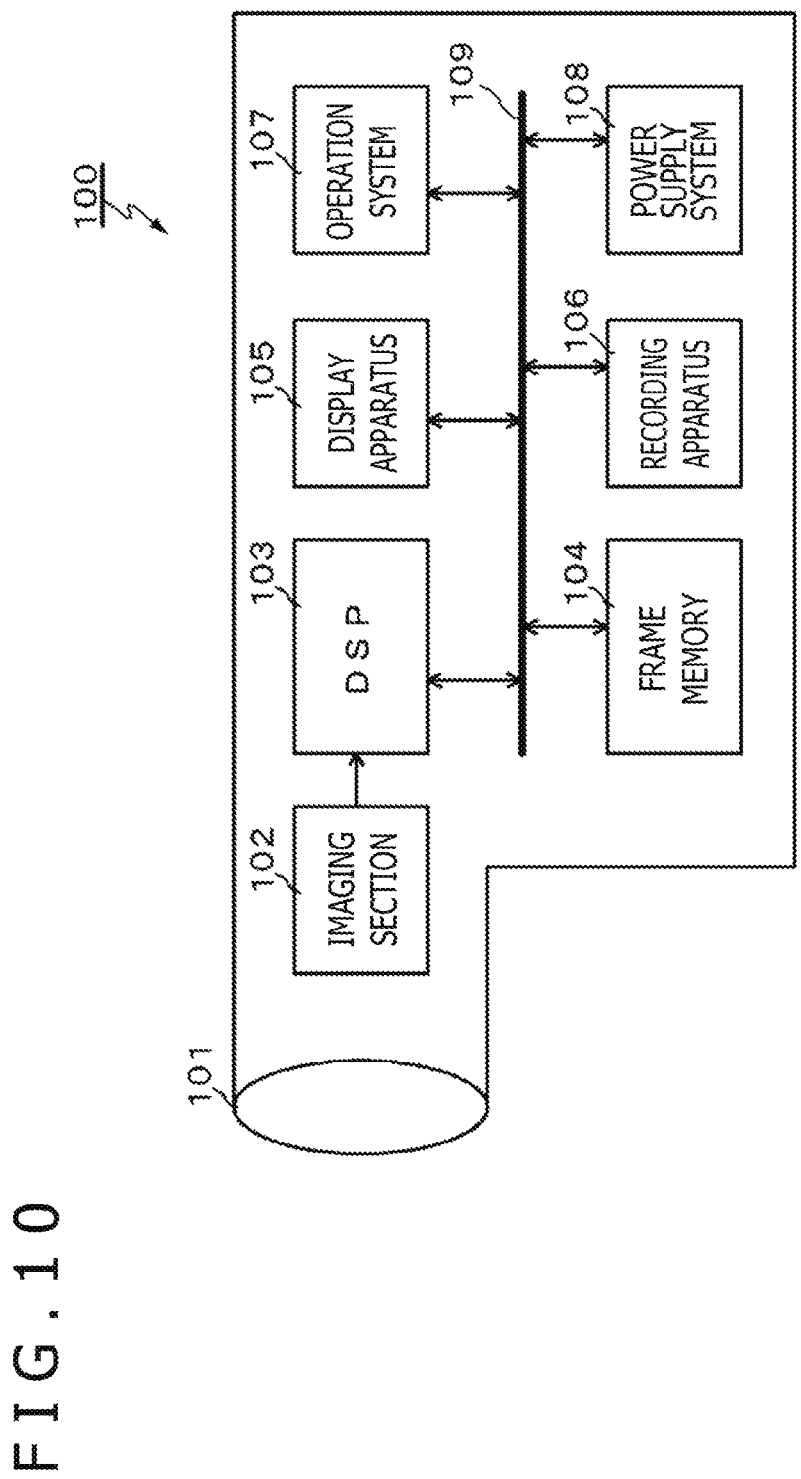
FIG. 10 is a block diagram illustrating a configuration of an imaging apparatus, an example of electronic equipment of the present disclosure.

FIG. 10 is a block diagram illustrating a configuration of an imaging apparatus, an example of electronic equipment of the present disclosure. As illustrated in FIG. 10, an imaging apparatus 100 according to the present example includes an imaging optics 101 including a lens group, an imaging section 102, a DSP circuit 103, a frame memory 104, a display apparatus 105, a recording apparatus 106, an operation system 107, a power system 108, and so on. Then, the DSP circuit 103, the frame memory 104, the display apparatus 105, the recording apparatus 106, the operation system 107, and the power system 108 are connected to each other via a bus line 109.

The imaging optics 101 captures incident light (image light) from a subject and forms an image on an imaging surface of the imaging section 102. The imaging section 102 converts, on a pixel-by-pixel basis, the amount of incident light whose image is formed on the imaging surface by the imaging optics 101, into an electric signal and outputs the signal as a pixel signal. The DSP circuit 103 performs general camera signal processing tasks such as a white balancing process, a demosaicing process, and a gamma correction process.

The frame memory 104 is used to store data as appropriate in the course of signal processing by the DSP circuit 103. The display apparatus 105 includes a panel display apparatus such as LCD apparatus or organic EL (electro luminescence) display apparatus and displays a video or still image captured by the imaging section 102. The recording section 106 records the video or still image captured by the imaging section 102 to a portable semiconductor memory, an optical disc, an HDD (Hard Disk Drive), or other media.

The operation system 107 issues, under user operation, operating instructions regarding various capabilities of the present imaging apparatus 100. The power system 108 supplies various power sources, operating power sources of the DSP circuit 103, the frame memory 104, the display apparatus 105, the recording apparatus 106, and the operation system 107, to these target sections as appropriate.

In the imaging apparatus 100 configured as described above, the CMOS image sensor 90 according to the present disclosure described earlier can be used as the imaging section 102. The CMOS image sensor 90 according to the present disclosure ensures reduced power consumption in the ΔΣ analog-digital converter 1. Therefore, it is possible to reduce the power consumption of the imaging apparatus 100 by using the CMOS image sensor 90 according to the present disclosure as the imaging section 102. Also, the CMOS image sensor 90 according to the present disclosure has significantly reduced input level dependence of current consumption, thus achieving higher constancy of current and suppressing streaking. This makes it possible to provide a display image free from image deterioration called streaking by using the CMOS image sensor 90 according to the present disclosure as the imaging section 102.

<Possible Configurations of the Present Disclosure>

It should be noted that the present disclosure can have the following configurations.

<<A. Analog-Digital Converter>>

[A-1]

An analog-digital converter including:

a loop filter having at least two cascaded integrators;

a quantization circuit section adapted to convert a loop filter output into a digital value; and a current steering digital-analog conversion section provided in a feedback loop that feeds back the output of the quantization circuit section to the loop filter, the analog-digital converter including:

a first input signal current path adapted to feed a first input signal current to an input end of a first stage integrator of the loop filter;

a second input signal current path adapted to feed a second input signal current, a current opposite in sign to the first input signal current, to an input end of a second stage integrator of the loop filter;

a first feedback current path adapted to connect one feedback output end of the current steering digital-analog conversion section to the input end of the first stage integrator of the loop filter; and a second feedback current path adapted to connect other feedback output end of the current steering digital-analog conversion section to the input end of the second stage integrator of the loop filter.

[A-2]

The analog-digital converter according to [A-1] described above, in which the loop filter operates the second stage integrator in inverted mode.

[A-3]

The analog-digital converter according to [A-1] or [A-2] described above including:

a voltage-current conversion circuit section adapted to supply a first input signal current and a second input signal current at an input stage.

[A-4]

The analog-digital converter according to [A-3] described above, in which the voltage-current conversion circuit section includes a current source adapted to feed a bias current; and a circuit section adapted to distribute the bias current as the first input signal current and the second input signal current.

[A-5]

The analog-digital converter according to [A-3] described above, in which the voltage-current conversion circuit section includes a differential transconductance amplifier.

[A-6]

The analog-digital converter of any one according to any one of [A-1] to [A-5] described above, in which the loop filter includes an active RC integrator.

<<B. Solid-State Imaging Element>>

[B-1]

A solid-state imaging element including:

a pixel array section having unit pixels, each including a photoelectric conversion section, arranged in a matrix pattern; and a column processing section including analog-digital converters adapted to convert analog pixel signals, output from the unit pixels, into digital pixel signals, in which each of the analog-digital converters includes:

a loop filter having at least two cascaded integrators;

a quantization circuit section adapted to convert a loop filter output into a digital value; and a current steering digital-analog conversion section provided in a feedback loop that feeds back the output of the quantization circuit section to the loop filter, each of the analog-digital converters including:

a first input signal current path adapted to feed a first input signal current to an input end of a first stage integrator of the loop filter;

a second input signal current path adapted to feed a second input signal current, a current opposite in sign to the first input signal current, to an input end of a second stage integrator of the loop filter;

a first feedback current path adapted to connect one feedback output end of the current steering digital-analog conversion section to the input end of the first stage integrator of the loop filter; and a second feedback current path adapted to connect other feedback output end of the current steering digital-analog conversion section to the input end of the second stage integrator of the loop filter.

[B-2]

The solid-state imaging element according to [B-1] described above, in which the loop filter operates the second stage integrator in inverted mode.

[B-3]

The solid-state imaging element according to [B-1] or [B-2] described above including:

a voltage-current conversion circuit section adapted to supply a first input signal current and a second input signal current at an input stage.

[B-4]

The solid-state imaging element according to [B-3] described above, in which the voltage-current conversion circuit section includes a current source adapted to feed a bias current, and a circuit section adapted to distribute the bias current as the first input signal current and the second input signal current.

[B-5]

The solid-state imaging element according to [B-3] described above, in which the voltage-current conversion circuit section includes a differential transconductance amplifier.

[B-6]

The solid-state imaging element according to [B-4] or [B-5] described above, in which a reset level at the time of resetting of a charge accumulation section and a signal level at the time of photoelectric conversion with a photoelectric conversion element are output as analog pixel signals from a unit pixel, and the voltage-current conversion circuit section takes the difference between the reset level and the signal level.

[B-7]

The solid-state imaging element according to any one of [B-1] to [B-6] described above, in which
the loop filter includes an active RC integrator.

<<C. Electronic Equipment>>

[C-1]

Electronic equipment including:
a solid-state imaging element, the solid-state imaging element including:
a pixel array section having unit pixels, each including a photoelectric conversion section, arranged in a matrix pattern; and
a column processing section including analog-digital converters adapted to convert analog pixel signals, output from the unit pixels, into digital pixel signals, in which
each of the analog-digital converters includes:
a loop filter having at least two cascaded integrators;
a quantization circuit section adapted to convert a loop filter output into a digital value; and
a current steering digital-analog conversion section provided in a feedback loop that feeds back the output of the quantization circuit section to the loop filter, each of the analog-digital converters including:
a first input signal current path adapted to feed a first input signal current to an input end of a first stage integrator of the loop filter;
a second input signal current path adapted to feed a second input signal current, a current opposite in sign to the first input signal current, to an input end of a second stage integrator of the loop filter;
a first feedback current path adapted to connect one feedback output end of the current steering digital-analog conversion section to the input end of the first stage integrator of the loop filter; and
a second feedback current path adapted to connect other feedback output end of the current steering digital-analog conversion section to the input end of the second stage integrator of the loop filter.

[C-2]

The electronic equipment according to [C-1] described above, in which
the loop filter operates the second stage integrator in inverted mode.

[C-3]

The electronic equipment according to [C-1] or [C-2] described above including:
a voltage-current conversion circuit section adapted to supply a first input signal current and a second input signal current at an input stage.

[C-4]

The electronic equipment according to [C-3] described above, in which
the voltage-current conversion circuit section includes a current source adapted to feed a bias current, and a circuit section adapted to distribute the bias current as the first input signal current and the second input signal current.

[C-5]

The electronic equipment according to [C-3] described above, in which
the voltage-current conversion circuit section includes a differential transconductance amplifier.

[C-6]

The electronic equipment of according to [C-4] or [C-5] described above, in which
a reset level at the time of resetting of a charge accumulation section and a signal level at the time of photoelectric conversion with a photoelectric conversion element are output as analog pixel signals from a unit pixel, and
the voltage-current conversion circuit section takes the difference between the reset level and the signal level.

[C-7]

The electronic equipment of according to any one of [C-1] to [C-6] described above, in which
the loop filter includes an active RC integrator.

REFERENCE SIGNS LIST

1 . . . Continuous-time $\Delta\Sigma$ analog-digital converter, 2 . . . Unit pixel, 10 . . . Loop filter, 20 . . . Quantization circuit section, 30 . . . Decimation filter, 40 . . . First digital-analog conversion section, 50 . . . Second digital-analog conversion section, 60 . . . Control circuit section, 70 . . . Current generation section, 80 . . . Voltage-current conversion circuit section, 90 . . . CMOS image sensor, 91 . . . Pixel array section, 92 . . . Vertical driving section, 93 . . . Column processing section, 94 . . . Horizontal driving section, 95 . . . System control section, 96 (961 to 96m) . . . Pixel driving lines, 97 ($97_1$ to $97_n$) Vertical signal lines, 98 . . . Signal processing section, 99 . . . Data storage section, $L_{input\_1}$ . . . First input signal current path, $L_{input\_2}$ . . . Second input signal current path, $L_{feedback\_1}$ . . . First feedback current path, $L_{feedback\_2}$ . . . Second feedback current path

The invention claimed is:

1. An analog-digital converter, comprising:
a loop filter having at least two cascaded integrators;
a quantization circuit section configured to convert a loop filter output into a digital value;
a current steering digital-analog conversion section in a feedback loop that feeds back an output of the quantization circuit section to the loop filter, wherein
the current steering digital-analog conversion section includes a first current source, a first switching element, and a second switching element, and
a first end of two ends of the first switching element and a first end of two ends of the second switching element are connected to the first current source;
a first input signal current path configured to feed a first input signal current to an input end of a first stage integrator of the loop filter;
a second input signal current path configured to feed a second input signal current to an input end of a second stage integrator of the loop filter, wherein the second input signal current is opposite in sign to the first input signal current;
a first feedback current path configured to connect a second end of the two ends of the first switching element to the input end of the first stage integrator of the loop filter; and
a second feedback current path configured to connect a second end of the two ends of the second switching element to the input end of the second stage integrator of the loop filter.

2. The analog-digital converter according to claim 1, wherein the second stage integrator is configured to operate in an inverted mode.

3. The analog-digital converter according to claim 1, further comprising a voltage-current conversion circuit section configured to supply the first input signal current and the second input signal current at an input stage.

4. The analog-digital converter according to claim 3, wherein the voltage-current conversion circuit section includes a
   second current source configured to feed a bias current,
   and
a circuit section configured to distribute the bias current as
   the first input signal current and the second input signal
   current.

5. The analog-digital converter according to claim 3, wherein the voltage-current conversion circuit section includes a differential transconductance amplifier.

6. The analog-digital converter according to claim 1, wherein the loop filter includes an active RC integrator.

7. A solid-state imaging element, comprising:
a pixel array section having unit pixels in a matrix pattern, wherein each of the unit pixels includes a photoelectric conversion section, and the unit pixels are configured to output analog pixel signals; and
a column processing section that includes analog-digital converters configured to convert the analog pixel signals into digital pixel signals, wherein
each of the analog-digital converters includes:
   a loop filter having at least two cascaded integrators;
   a quantization circuit section configured to convert a loop filter output into a digital value;
   a current steering digital-analog conversion section in a feedback loop that feeds back an output of the quantization circuit section to the loop filter, wherein the current steering digital-analog conversion section includes a first current source, a first switching element, and a second switching element; and
      a first end of two ends of the first switching element and a first end of two ends of the second switching element are connected to the first current source;
   a first input signal current path configured to feed a first input signal current to an input end of a first stage integrator of the loop filter;
   a second input signal current path configured to feed a second input signal current to an input end of a second stage integrator of the loop filter, wherein the second input signal current is opposite in sign to the first input signal current;
   a first feedback current path configured to connect a second end of the two ends of the first switching element to the input end of the first stage integrator of the loop filter; and
   a second feedback current path configured to connect a second end of the two ends of the second switching element to the input end of the second stage integrator of the loop filter.

8. The solid-state imaging element according to claim 7, wherein the second stage integrator is configured to operate in an inverted mode.

9. The solid-state imaging element according to claim 7, further comprising a voltage-current conversion circuit section configured to supply the first input signal current and the second input signal current at an input stage.

10. The solid-state imaging element according to claim 9, wherein
the voltage-current conversion circuit section includes a
   second current source configured to feed a bias current,
   and
a circuit section configured to distribute the bias current as
   the first input signal current and the second input signal
   current.

11. The solid-state imaging element according to claim 9, wherein the voltage-current conversion circuit section includes a differential transconductance amplifier.

12. The solid-state imaging element according to claim 11, wherein
each of the unit pixels further includes a charge accumulation section, and
a reset level at a time of reset of the charge accumulation section and a signal level at a time of photoelectric conversion with a photoelectric conversion element of the photoelectric conversion section are output as the analog pixel signals.

13. The solid-state imaging element according to claim 7, wherein the loop filter includes an active RC integrator.

14. An electronic equipment, comprising:
a solid-state imaging element, the solid-state imaging element including:
   a pixel array section having unit pixels in a matrix pattern, wherein
      each of the unit pixels includes a photoelectric conversion section, and
      the unit pixels are configured to output analog pixel signals; and
   a column processing section that includes analog-digital converters configured to convert the analog pixel signals into digital pixel signals, wherein
   each of the analog-digital converters includes:
      a loop filter having at least two cascaded integrators;
      a quantization circuit section configured to convert a loop filter output into a digital value;
      a current steering digital-analog conversion section in a feedback loop that feeds back an output of the quantization circuit section to the loop filter, wherein
         the current steering digital-analog conversion section includes a first current source, a first switching element, and a second switching element, and
         a first end of two ends of the first switching element and a first end of two ends of the second switching element are connected to the first current source;
      a first input signal current path configured to feed a first input signal current to an input end of a first stage integrator of the loop filter;
      a second input signal current path configured to feed a second input signal current to an input end of a second stage integrator of the loop filter, wherein the second input signal current is opposite in sign to the first input signal current;
      a first feedback current path configured to connect a second end of the two ends of the first switching element to the input end of the first stage integrator of the loop filter; and
      a second feedback current path configured to connect a second end of the two ends of the second switching element to the input end of the second stage integrator of the loop filter.

15. The electronic equipment according to claim 14, wherein the second stage integrator is configured to operate in an inverted mode.

16. The electronic equipment according to claim 14, further comprising a voltage-current conversion circuit section configured to supply the first input signal current and the second input signal current at an input stage.

17. The electronic equipment according to claim 16, wherein
the voltage-current conversion circuit section includes a
   second current source configured to feed a bias current;
   and a circuit section configured to distribute the bias current as the first input signal current and the second input signal current.

18. The electronic equipment according to claim 16, wherein the voltage-current conversion circuit section includes a differential transconductance amplifier.

19. The electronic equipment according to claim 18, wherein
each of the unit pixels further includes a charge accumulation section, and
a reset level at a time of reset of the charge accumulation section and a signal level at a time of photoelectric conversion with a photoelectric conversion element of the photoelectric conversion section are output as the analog pixel signals.

20. The electronic equipment according to claim 14, wherein the loop filter includes an active RC integrator.

* * * * *